US012747343B2

(12) United States Patent
Nakanishi et al.

(10) Patent No.: US 12,747,343 B2
(45) Date of Patent: Sep. 29, 2026

(54) CURABLE COMPOSITIONS

(71) Applicant: AGC Multi Material America, Inc., Tempe, AZ (US)

(72) Inventors: Tomoaki Nakanishi, Tempe, AZ (US); Wei Qiang, Singapore (SG); Naichun Liu, Singapore (SG); Gregory Roy Almen, Tempe, AZ (US); Kevin Bivona, Tempe, AZ (US); Yoji Nakajima, Tempe, AZ (US); William Douglas Leys, Tustin, CA (US)

(73) Assignee: AGC Multi Material America, Inc., Tempe, AZ (US)

( * ) Notice: Subject to any disclaimer, the term of this patent is extended or adjusted under 35 U.S.C. 154(b) by 718 days.

(21) Appl. No.: 18/112,065

(22) Filed: Feb. 21, 2023

(65) Prior Publication Data

US 2023/0265275 A1 Aug. 24, 2023

Related U.S. Application Data

(60) Provisional application No. 63/312,415, filed on Feb. 22, 2022.

(51) Int. Cl.

| | |
|---|---|
| ***C08L 25/08*** | (2006.01) |
| ***C08J 5/24*** | (2006.01) |
| ***H05K 1/03*** | (2006.01) |

(52) U.S. Cl.

CPC ............... *C08L 25/08* (2013.01); *C08J 5/244* (2021.05); *H05K 1/0366* (2013.01); *C08J 2325/08* (2013.01); *C08J 2425/08* (2013.01); *C08L 2201/02* (2013.01); *C08L 2203/20* (2013.01); *C08L 2205/025* (2013.01); *C08L 2205/03* (2013.01); *H05K 2201/029* (2013.01); *H05K 2201/0355* (2013.01)

(58) Field of Classification Search

None

See application file for complete search history.

(56) References Cited

U.S. PATENT DOCUMENTS

| | | | |
|---|---|---|---|
| 8,227,361 | B2 | 7/2012 | Amou et al. |
| 9,258,892 | B2 | 2/2016 | Crosley |
| 11,130,861 | B2 | 9/2021 | Kawabe et al. |
| 11,134,568 | B2 | 9/2021 | Nishimura et al. |
| 11,339,251 | B2 | 5/2022 | Nagai et al. |
| 11,377,546 | B2 | 7/2022 | Tanigawa et al. |
| 12,258,445 | B2 | 3/2025 | Zhang et al. |
| 2013/0034725 | A1 | 2/2013 | Paul |
| 2017/0226302 | A1 | 8/2017 | Saito et al. |
| 2018/0170005 | A1 | 6/2018 | Saito et al. |
| 2020/0281076 | A1 | 9/2020 | Nishimura et al. |
| 2020/0347219 | A1 | 11/2020 | Ding et al. |
| 2021/0108073 | A1 | 4/2021 | Kawabe et al. |
| 2021/0246251 | A1 | 8/2021 | Sato et al. |
| 2021/0298169 | A1 | 9/2021 | Wu et al. |
| 2022/0235179 | A1 | 7/2022 | Hifumi et al. |
| 2022/0248526 | A1 | 8/2022 | Shiobara et al. |
| 2022/0251254 | A1 | 8/2022 | Shimono et al. |
| 2024/0174623 | A1 | 5/2024 | Kuray et al. |
| 2024/0174802 | A1 | 5/2024 | Kuray et al. |
| 2024/0174803 | A1 | 5/2024 | Zhang et al. |
| 2024/0182677 | A1 | 6/2024 | Nakanishi et al. |

FOREIGN PATENT DOCUMENTS

| | | | |
|---|---|---|---|
| CN | 104053302 | A | 9/2014 |
| CN | 110461891 | A | 11/2019 |
| CN | 112979707 | B | 9/2022 |
| CN | 118047914 | A | 5/2024 |
| JP | S63-172747 | A | 7/1988 |
| JP | 2002026493 | A | 1/2002 |
| JP | 2008231280 | A | 10/2008 |
| JP | 2008248001 | | 10/2008 |
| JP | 4338951 | | 10/2009 |
| JP | 4842024 | | 12/2011 |
| JP | 5162149 | | 3/2013 |
| JP | 5249095 | | 7/2013 |
| JP | 2014080478 | A | 5/2014 |
| JP | 2018039995 | | 3/2018 |
| JP | 2019054242 | A | 4/2019 |
| JP | 2020026515 | A | 2/2020 |
| JP | 2020105352 | | 7/2020 |
| JP | 6981007 | | 12/2021 |
| JP | 7087859 | B2 | 6/2022 |

(Continued)

OTHER PUBLICATIONS

International Preliminary Report on Patentability in International Appln. No. PCT/US2023/062934, mailed on Sep. 6, 2024, 9 pages.

Sunitha et al., "Kinetics of Alder-ene reaction of Tris(2-allylphenoxy)triphenoxycyclotriphosphazene and bismaleimides—a DSC study," Thermochimica Acta, Jul. 2001, 374(2):159-169.

Third-Party Observation in Taiwan Appln. No. 112143909, dated Nov. 12, 2024, 54 pages (with English Translation).

Wang, "Synthesis and characterization of novel pyrimidine-containing poly(arylene ether)s," High Performance Polymers, Jun. 2014, 27(1):59-64.

International Search Report and Written Opinion in International Appln. No. PCT/US2023/062934, dated May 16, 2023, 9 pages.

(Continued)

*Primary Examiner* — Sanza L. McClendon

(74) *Attorney, Agent, or Firm* — Fish & Richardson P.C.

(57) ABSTRACT

This disclosure relates to a curable composition that includes at least first, second, and third polymers. The first polymer includes a first monomer unit and a second monomer unit different from the first monomer unit, in which the first monomer unit has the structure of formula (I) defined in the Specification and the second monomer unit has the structure of formula (II) defined in the Specification. The second polymer includes at least about 60 wt % of a styrene monomer unit; and the third polymer includes at most about 60 wt % of a styrene monomer unit. This disclosure also relates to using the composition to form a free-standing film, a laminate, a prepreg, and/or a printed circuit board.

46 Claims, No Drawings

(56) References Cited

FOREIGN PATENT DOCUMENTS

| | | | |
|---|---|---|---|
| JP | 7115165 | B2 | 8/2022 |
| KR | 20010045346 | A | 6/2001 |
| KR | 10-2019-0127753 | A | 11/2019 |
| TW | 201843193 | A | 12/2018 |
| TW | 202214746 | A | 4/2022 |
| TW | 202305034 | A | 2/2023 |
| WO | WO 2003/048249 | A1 | 6/2003 |
| WO | WO 2017115813 | | 7/2017 |
| WO | WO 2018181842 | | 10/2018 |
| WO | WO 2020175538 | A1 | 9/2020 |
| WO | WO 2020179443 | A1 | 9/2020 |
| WO | WO 2020213639 | A1 | 10/2020 |
| WO | WO 2021112088 | | 6/2021 |
| WO | WO 2022050064 | A1 | 3/2022 |
| WO | WO 2022172551 | A1 | 8/2022 |
| WO | WO 2022210095 | A1 | 10/2022 |
| WO | WO 2024053282 | A1 | 3/2024 |

OTHER PUBLICATIONS

Office Action in Chinese Appln. No. 202380009324.9, mailed on Apr. 30, 2026, 10 pages (with English translation).

Office Action in Taiwanese Appln. No. 112106460, mailed on Apr. 23, 2026, 24 pages (with English translation).

CURABLE COMPOSITIONS

CROSS-REFERENCE TO RELATED APPLICATION

The present application claims priority to U.S. Provisional Application Ser. No. 63/312,415, filed on Feb. 22, 2022, the contents of which are hereby incorporated by reference in their entirety.

TECHNICAL FIELD

The present disclosure relates to curable compositions, as well as related methods, laminates, prepregs, and circuit boards.

BACKGROUND

To meet demands of high radio frequency transmission, requirements for a high frequency transmission system and wireless communication equipment in the industry are constantly increased. Generally, a circuit assembly includes a conductive metal layer and a dielectric substrate layer. To meet the demands of high frequency transmission, the dielectric substrate layer needs to have a low dielectric loss (Df) (e.g., at most 0.0020).

SUMMARY

The present disclosure is based on the unexpected discovery that certain curable compositions that include styrene-containing polymers can exhibit superior electrical properties (e.g., low Dk and Df), improved stability, improved mechanical properties (interlayer bond strength), and improved adhesion properties (e.g., peel strength) with other materials.

In one aspect, the present disclosure features curable compositions (e.g., curable resin compositions) that include (1) at least one first polymer comprising a first monomer unit and a second monomer unit different from the first monomer unit, (2) at least one second polymer comprising at least about 60 wt % of a styrene monomer unit; and (3) at least one third polymer comprising at most about 60 wt % of a styrene monomer unit. The first monomer unit has the structure of formula (I):

(I)

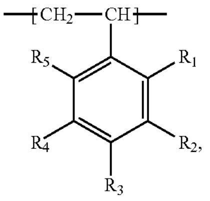

in which each of $R_1$, $R_2$, $R_3$, $R_4$, and $R_5$, independently, is H, halo, $C_1$-$C_6$ alkyl, or $C_2$-$C_6$ alkenyl, and the second monomer unit has the structure of formula (II):

(II)

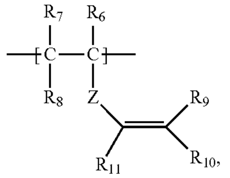

in which Z is arylene and each of $R_6$, $R_7$, $R_8$, $R_9$, $R_{10}$, and $R_{11}$, independently, is H or $C_1$-$C_6$ alkyl.

In another aspect, the present disclosure features a film (e.g., a free-standing or supported film) prepared from a curable composition described herein.

In another aspect, the present disclosure features a prepreg product that includes a woven or non-woven substrate impregnated with a curable composition described herein.

In another aspect, the present disclosure features a laminate that includes at least one layer prepared from a prepreg product described herein.

In another aspect, the present disclosure features a circuit board (e.g., a printed circuit board) for use in an electronic product that includes a laminate described herein.

In still another aspect, the present disclosure features a method that includes: impregnating a woven or non-woven substrate with a curable composition described herein; and curing the composition to form a prepreg product.

The details of one or more embodiments of the disclosed compositions and methods are set forth in the description below. Other features, objects, and advantages of the disclosed compositions and methods will be apparent from the description and the claims.

DETAILED DESCRIPTION

As defined herein, unless otherwise noted, all percentages expressed should be understood to be percentages by weight of the total weight of the curable composition. i.e., weight percent. Unless otherwise noted, ambient temperature mentioned herein refers to 25° C.

In general, the present disclosure is directed to curable compositions that include at least one (e.g., two or three or more) first polymer, at least one (e.g., two or three or more) second polymer, and at least one (e.g., two or three or more) third polymer. The first, second, and third polymers are different from each other. In some embodiments, the polymer described herein can be a homopolymer or a copolymer (e.g., a random copolymer, a graft copolymer, an alternating copolymer, or a block copolymer) unless stated otherwise. In some embodiments, the curable compositions described herein do not include a polymer other than the first, second, and third polymers described herein.

In some embodiments, the first polymer described herein includes at least one (e.g., two or three or more) first monomer unit and at least one (e.g., two or three or more) second monomer unit different from the first monomer unit. The phrase "monomer unit" mentioned herein refers to a group in a polymer formed from a monomer and is used interchangeably with "monomer repeat unit" known in the art. In some embodiments, the first polymer includes the first and second monomer units only and does not include any other monomer unit.

In some embodiments, the first monomer unit has the structure of formula (I):

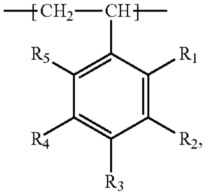

(I)

in which each of $R_1$, $R_2$, $R_3$, $R_4$, and $R_5$, independently, is H, halo (e.g., F, Cl, Br, or I), $C_1$-$C_6$ alkyl (e.g., methyl, ethyl, propyl, butyl, pentyl, or hexyl), or $C_2$-$C_6$ alkenyl (e.g., vinyl, propenyl, or allyl).

Examples of monomers that can be used to form the first monomer unit include styrene, o-methyl styrene, m-methyl styrene, p-methyl styrene, o-ethyl styrene, m-ethyl styrene, p-ethyl styrene, o-propyl styrene, m-propyl styrene, p-propyl styrene, o-butyl styrene, m-butyl styrene, p-butyl styrene, o-isobutyl styrene, m-isobutyl styrene, p-isobutyl styrene, o-t-butyl styrene, m-t-butyl styrene, p-t-butyl styrene, o-n-pentyl styrene, m-n-pentyl styrene, p-n-pentyl styrene, o-2-methylbutyl styrene, m-2-methylbutyl styrene, p-2-methylbutyl styrene, o-3-methylbutyl styrene, m-3-methylbutyl styrene, p-3-methylbutyl styrene, o-t-pentyl styrene, m-t-pentyl styrene, p-t-pentyl styrene, o-n-hexyl styrene, m-n-hexyl styrene, p-n-hexyl styrene, o-2-methylpentyl styrene, m-2-methylpentyl styrene, p-2-methylpentyl styrene, o-3-methylpentyl styrene, m-3-methylpentyl styrene, p-3-methylpentyl styrene, o-1-methylpentyl styrene, m-1-methylpentyl styrene, p-1-methylpentyl styrene, o-2,2-dimethylbutyl styrene, m-2,2-dimethylbutyl styrene, p-2,2-dimethylbutyl styrene, o-2,3-dimethylbutyl styrene, m-2,3-dimethylbutyl styrene, p-2,3-dimethylbutyl styrene, o-2,4-dimethylbutyl styrene, m-2,4-dimethylbutyl styrene, p-2,4-dimethylbutyl styrene, o-3,3-dimethylbutyl styrene, m-3,3-dimethylbutyl styrene, p-3,3-dimethylbutyl styrene, o-3,4-dimethylbutyl styrene, m-3,4-dimethylbutyl styrene, p-3,4-dimethylbutyl styrene, o-4,4-dimethylbutyl styrene, m-4,4-dimethylbutyl styrene, p-4,4-dimethylbutyl styrene, o-2-ethylbutyl styrene, m-2-ethylbutyl styrene, p-2-ethylbutyl styrene, o-1-ethylbutyl styrene, m-1-ethylbutyl styrene, and p-1-ethylbutyl styrene.

In some embodiments, the second monomer unit has the structure of formula (II):

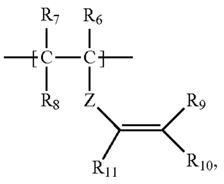

(II)

in which Z is arylene (e.g., a phenylene or naphthalene group) and each of $R_6$, $R_7$, $R_8$, $R_9$, $R_{10}$, and $R_{11}$, independently, is H or $C_1$-$C_6$ alkyl (e.g., methyl, ethyl, propyl, butyl, pentyl, or hexyl). As used herein, the term "arylene" includes unsubstituted arylene and substituted arylene, such as arylene substituted by one or more (e.g., two or three or more) $C_1$-$C_6$ alkyl (e.g., methyl, ethyl, propyl, butyl, pentyl, or hexyl).

Examples of monomers that can be used to form the second monomer unit include o-divinylbenzene, m-divinylbenzene, p-divinylbenzene, 1,2-diisopropenylbenzene, 1,3-diisopropenylbenzene, 1,4-diisopropenylbenzene, 1,3-divinylnaphthalene, 1,8-divinylnaphthalene, 1,4-divinylnaphthalene, 1,5-divinylnaphthalene, 2,3-divinylnaphthalene, 2,7-divinylnaphthalene, 2,6-divinylnaphthalene, 1,2-divinyl-3,4-dimethylbenzene, 1,3-divinyl-4,5,8-tributyl naphthalene.

In some embodiments, the first polymer can optionally further include at least one (e.g., two or three or more) third monomer unit different from the first and second monomer units. In some embodiments, the third monomer unit includes a structure of formula (I), a norbornene group, a (meth)acrylate group, or an indane group. As used herein, each of the norbornene, (meth)acrylate, and indane groups includes unsubstituted groups and substituted groups, such as those substituted by one or more (e.g., two or three or more) $C_1$-$C_6$ alkyl (e.g., methyl, ethyl, propyl, butyl, pentyl, or hexyl). In addition, as used herein, the term "(meth) acrylate" includes both acrylates and methacrylates. In some embodiments, the third monomer unit includes an unsaturated group (e.g., an unsaturated hydrocarbon group).

In some embodiments, the first polymer is in an amount of from at least about 5 wt % (e.g., at least about 6 wt %, at least about 8 wt %, at least about 10 wt %, at least about 12 wt %, at least about 14 wt %, at least about 15 wt %, at least about 16 wt %, at least about 18 wt %, at least about 20 wt %, at least about 25 wt %, or at least about 30 wt %) to at most about 60 wt % (e.g., at most about 55 wt %, at most about 50 wt %, at most about 45 wt %, at most about 40 wt %, at most about 35 wt %, at most about 30 wt %, at most about 25 wt %, at most about 20 wt %, at most about 15 wt %, or at most about 10 wt %) of the solid content of the curable compositions described herein. Preferably, the first polymer is in an amount of from about 10 wt % to about 50 wt % of the solid content of the curable compositions described herein. Without wishing to be bound by theory, it is believed that a curable composition containing the first polymer can have superior electrical properties (e.g., low Dk or Df) due at least in part to the fact that the first polymer is primarily made from hydrocarbon monomers.

In some embodiments, the second polymer described herein includes at least about 60 wt % of a styrene monomer unit (e.g., an unsubstituted styrene monomer unit, a methylstyrene monomer unit, a t-butylstyrene monomer unit, or a bromostyrene monomer unit). As used herein, the phrase "styrene monomer unit" includes both unsubstituted and substituted styrene monomer units (e.g., the first monomer unit having the structure of formula (I) described above) and refers to a group formed from an unsubstituted or substituted styrene monomer. Suitable substituents for the styrene monomer unit can include halo (e.g., F, CI, Br, or I) and $C_1$-$C_6$ alkyl (e.g., methyl, ethyl, propyl, butyl, pentyl, or hexyl). Examples of styrene monomers that can be used to form the styrene monomer units in the second polymer can be the same as those described above with respect to the first monomer unit in the first polymer.

In some embodiments, the styrene monomer unit is in an amount of from at least about 60 wt % (e.g., at least about 61 wt %, at least about 62 wt %, at least about 64 wt %, at least about 65 wt %, at least about 66 wt %, at least about 68 wt %, at least about 70 wt %, at least about 72 wt %, at least about 74 wt %, at least about 75 wt %, at least about 76 wt %, at least about 78 wt %, or at least about 80 wt %) to at most about 100 wt % (e.g., at most about 99 wt %, at most about 98 wt %, at most about 96 wt %, at most about 95 wt %, at most about 94 wt %, at most about 92 wt %, at most about 90 wt %, at most about 85 wt %, at most about 80 wt %, at most about 75 wt %, or at most about 70 wt %) of the second polymer. In some embodiments, the styrene monomer unit is in an amount of from about 65 wt % to about 80 wt % of the second polymer. Without wishing to be bound by theory, it is believed that including a second polymer having at least about 60 wt % (e.g., from about 65 wt % to about 80 wt %) of a styrene monomer unit can significantly improve the compatibility of the first and third polymers in the curable compositions described herein, which in turn improves the uniformity, stability and storage life of the curable compositions before they are cured, reduces phase separation in the laminates formed by the curable compositions, and improves uniformity and processability of the prepregs and circuit boards formed from the curable compositions. By contrast, without wishing to be bound by theory, it is believed that, if the styrene monomer unit in the second polymer is less than about 60 wt %, the second polymer may not have sufficient compatibility with the first polymer. In some embodiments, without wishing to be bound by theory, it is believed that a second polymer having more than about 80 wt % of a styrene monomer unit may be more brittle and less compatible with the third polymer described herein than a second polymer having from about 65 wt % to about 80 wt % of a styrene monomer unit even though the former may still be suitable for the intended purposes of the present disclosure.

In some embodiments, the second polymer described herein can optionally further include an ethylene monomer unit, a propylene monomer unit, a butylene monomer unit, an isobutylene monomer unit, a butadiene monomer unit, an isoprene monomer unit, or a cyclohexene monomer unit.

Examples of suitable second polymers include a styrene isoprene styrene (SIS) block copolymer, a styrene isoprene propylene styrene (SIPS) block copolymer, a styrene isoprene butylene styrene (SIBS) block copolymer, a styrene butylene styrene (SBS) block copolymer, a styrene propylene styrene (SPS) block copolymer, a styrene butylene block copolymer, a styrene butadiene block copolymer, a styrene ethylene propylene styrene (SEPS) block copolymer, and a styrene ethylene butylene styrene (SEBS) block copolymer. In some embodiments, the second polymer can be a random copolymer containing the monomer units described herein.

In some embodiments, the second polymer is in an amount of from at least about 0.1 wt % (e.g., at least about 0.2 wt %, at least about 0.4 wt %, at least about 0.5 wt %, at least about 0.6 wt %, at least about 0.8 wt %, at least about 1 wt %, at least about 2 wt %, at least about 4 wt %, at least about 5 wt %, at least about 6 wt %, at least about 8 wt %, or at least about 10 wt %) to at most about 25 wt % (e.g., at most about 24 wt %, at most about 22 wt %, at most about 20 wt %, at most about 18 wt %, at most about 16 wt %, at most about 15 wt %, at most about 14 wt %, at most about 12 wt %, at most about 10 wt %, at most about 8 wt %, at most about 6 wt %, or at most about 5 wt %) of the solid content of the curable compositions described herein. Preferably, the second polymer is in an amount of from about 1 wt % to about 10 wt % of the solid content of the curable compositions described herein.

In some embodiments, the third polymer described herein includes at most about 60 wt % of a styrene monomer unit (e.g., an unsubstituted styrene monomer unit, a methylstyrene monomer unit, a t-butylstyrene monomer unit, or a bromostyrene monomer unit). Examples of monomers that can be used to form the styrene monomer units in the third polymer can be the same as those described above with respect to the first monomer unit in the first polymer.

In some embodiments, the styrene monomer unit is in an amount of from at least about 10 wt % (e.g., at least about 12 wt %, at least about 14 wt %, at least about 15 wt %, at least about 16 wt %, at least about 18 wt %, at least about 20 wt %, at least about 22 wt %, at least about 24 wt %, at least about 25 wt %, at least about 26 wt %, at least about 28 wt %, at least about 30 wt %, at least about 32 wt %, at least about 34 wt %, at least about 35 wt %, at least about 36 wt %, at least about 38 wt %, or at least about 40 wt %) to at most about 60 wt % (e.g., at most about 58 wt %, at most about 56 wt %, at most about 55 wt %, at most about 54 wt %, at most about 52 wt %, at most about 50 wt %, at most about 48 wt %, at most about 46 wt %, at most about 45 wt %, at most about 44 wt %, at most about 42 wt %, at most about 40 wt %, at most about 38 wt %, at most about 36 wt %, at most about 35 wt %, at most about 34 wt %, at most about 32 wt %, or at most about 30 wt %) of the third polymer. Without wishing to be bound by theory, it is believed that including a polymer having at most about 60 wt % of a styrene monomer unit can significantly improve mechanical properties (e.g., the interlayer bond strength and/or toughness) of the curable compositions described herein and the adhesion properties (e.g., peel strength) between a curable composition and a metal substrate (e.g., a copper or aluminum foil). By contrast, without wishing to be bound by theory, it is believed that, if the styrene monomer unit in the third polymer is less than about 10 wt %, the third polymer may not have sufficient compatibility with the first and second polymers. In addition, without wishing to be bound by theory, it is believed that, if the styrene monomer unit in the third polymer is more than about 60 wt %, the curable compositions described herein may not have sufficient mechanical properties.

In some embodiments, the third polymer described herein can optionally further include an ethylene monomer unit, a propylene monomer unit, a butylene monomer unit, an isobutylene monomer unit, a butadiene monomer unit, an isoprene monomer unit, or a cyclohexene monomer unit.

In some embodiments, the third polymer can further include a functional group to improve adhesion. In general, the functional group in the third polymer can be a group capable of reacting with the other components (e.g., the first and second polymers) in the curable compositions described herein. For example, the function group in the third polymer can be an oxygen-containing group (e.g., a succinic anhydride group) or a nitrogen-containing group (e.g., an amine group). In some embodiments, the function group in the third polymer can be a terminal or end group. For example, the third polymer can include a polymer modified by maleic anhydride or a polymer containing an amine end group.

Examples of suitable third polymers include a styrene ethylene butylene styrene block copolymer modified by maleic anhydride, a styrene ethylene butylene styrene block copolymer containing an amine end group, a styrene 4-methylstyrene isoprene butylene block copolymer, a 4-methylstyrene butylene block copolymer, and a styrene butadiene styrene block copolymer.

In some embodiments, the third polymer is in an amount of from at least about 0.1 wt % (e.g., at least about 0.2 wt %, at least about 0.4 wt %, at least about 0.5 wt %, at least about 0.6 wt %, at least about 0.8 wt %, at least about 1 wt %, at least about 2 wt %, at least about 4 wt %, at least about 5 wt %, at least about 6 wt %, at least about 8 wt %, or at least about 10 wt %) to at most about 25 wt % (e.g., at most about 24 wt %, at most about 22 wt %, at most about 20 wt %, at most about 18 wt %, at most about 16 wt %, at most about 15 wt %, at most about 14 wt %, at most about 12 wt %, at most about 10 wt %, at most about 8 wt %, at most about 6 wt %, or at most about 5 wt %) of the solid content of the curable compositions described herein. Preferably, the third polymer is in an amount of from about 1 wt % to about 10 wt % of the solid content of the curable compositions described herein.

In some embodiments, the curable compositions described herein can optionally further include at least one (e.g., two or three or more) additional polymer different from the first, second, and third polymers described above. Examples of such an additional polymer include polyphenylene ethers, polybutadienes, polystrenes (e.g., those made from unsubstituted styrene or substituted styrene monomers such as those described herein), polysiloxanes (e.g., polyvinylsiloxanes, polyallylsiloxanes, and copolymers thereof), and polysilsesquioxanes (e.g., open or closed cage types of polysilsesquioxanes). Without wishing to be bound by theories, it is believed that these additional polymers can lower the cost and/or improve the processability (e.g., lowering viscosity or improving flowability), the adhesion properties (e.g., peel strength), mechanical properties (e.g., the interlayer bond strength), and flammability of the curable compositions described herein.

In some embodiments, the additional polymer is in an amount of from at least about 0.1 wt % (e.g., at least about 0.2 wt %, at least about 0.4 wt %, at least about 0.5 wt %, at least about 0.6 wt %, at least about 0.8 wt %, at least about 1 wt %, at least about 2 wt %, at least about 4 wt %, at least about 5 wt %, at least about 6 wt %, at least about 8 wt %, or at least about 10 wt %) to at most about 30 wt % (e.g., at most about 28 wt %, at most about 26 wt %, at most about 25 wt %, at most about 24 wt %, at most about 22 wt %, at most about 20 wt %, at most about 18 wt %, at most about 16 wt %, at most about 15 wt %, at most about 14 wt %, at most about 12 wt %, at most about 10 wt %, at most about 8 wt %, at most about 6 wt %, or at most about 5 wt %) of the solid content of the curable compositions described herein. Preferably, the additional polymer is in an amount of from about 1 wt % to about 20 wt % of the solid content of the curable compositions described herein.

In some embodiments, the curable compositions described herein can optionally further include at least one (e.g., two or three or more) filler. In some embodiments, the filler can include silica (e.g., hollow silica), boron nitride, barium titanate, barium strontium titanate, titanium oxide, glass (e.g., hollow glass), a fluoro-containing polymer (e.g., polytetrafluoroethylene), or silicone. In some embodiments, the filler can be in the form of particles or powders.

Preferably, the curable compositions described herein include silica as a filler. Without wishing to be bound by theories, it is believed that the filler can improve the mechanical properties, thermal conductivity, and electrical properties and/or lower the coefficient thermal expansion (CTE) and costs of curable compositions described herein.

In some embodiments, the filler is in an amount of from at least about 1 wt % (e.g., at least about 2 wt %, at least about 4 wt %, at least about 5 wt %, at least about 6 wt %, at least about 8 wt %, at least about 10 wt %, at least about 15 wt %, at least about 20 wt %, at least about 25 wt %, at least about 30 wt %, at least about 35 wt %, or at least about 40 wt %) to at most about 80 wt % (e.g., at most about 75 wt %, at most about 70 wt %, at most about 65 wt %, at most about 60 wt %, at most about 55 wt %, at most about 50 wt %, at most about 45 wt %, at most about 40 wt %, at most about 35 wt %, at most about 30 wt %, at most about 25 wt %, at most about 20 wt %, at most about 15 wt %, at most about 10 wt %, or at most about 5 wt %) of the solid content of the curable compositions described herein. Preferably, the filler is in an amount of from about 5 wt % to about 50 wt % of the solid content of the curable compositions described herein.

In some embodiments, the curable compositions described herein can optionally further include at least one (e.g., two or three or more) radical initiator. In some embodiments, the radical initiator can include a peroxide (e.g., di-(tert-butylperoxyisopropyl)benzene, 2,5-dimethyl-2,5-di (t-butylperoxy]hexyne-3,2,5-dimethyl-2,5-di(t-butylperoxy]hexane, or dicumylperoxide), an aromatic hydrocarbon (e.g., 3,4-dimethyl 3,4-diphenyl hexane or 2,3-dimethyl 2,3-diphenyl butane), or an azo compound. Without wishing to be bound by theory, it is believed the radical initiator can facilitate the curing of a curable composition when the composition is used to form a prepreg product or a laminate. In embodiments when the curable compositions described herein do not include a radical initiator, the compositions can be cured by heating.

In some embodiments, the radical initiator is in an amount of from at least about 0.01 wt % (e.g., at least about 0.02 wt %, at least about 0.04 wt %, at least about 0.05 wt %, at least about 0.06 wt %, at least about 0.08 wt %, at least about 0.1 wt %, at least about 0.2 wt %, at least about 0.4 wt %, at least about 0.5 wt %, at least about 0.6 wt %, at least about 0.8 wt %, or at least about 1 wt %) to at most about 10 wt % (e.g., at most about 9 wt %, at most about 8 wt %, at most about 7 wt %, at most about 6 wt %, at most about 5 wt %, at most about 4 wt %, at most about 3 wt %, at most about 2 wt %, or at most about 1 wt %) of the solid content of the curable compositions described herein. Preferably, the radical initiator is in an amount of from about 0.1 wt % to about 5 wt % of the solid content of the curable compositions described herein.

In some embodiments, the curable compositions described herein can optionally further include at least one (e.g., two or three or more) cross-linking agent. In some embodiments, the cross-linking agent can include triallyl isocyanurate, triallyl cyanurate, a bis(vinylphenyl)ether, a bromostyrene (e.g., a dibromostyrene), a polybutadiene, a poly(butadiene-co-styrene) copolymer, divinylbenzene, a di(meth)acrylate, a maleimide compound (e.g., a bismaleimide), a dimethylimidazole, a dicyclopentadiene, a tricyclopentadiene, allyl benzoxazine, allyl phosphazene, 2,4-diphenyl-4-methyl-1-pentene, trans-stilbene, 5-vinyl-2-norbornene, acenaphthylene, tricyclopentadiene, dimethano-1H-benz[f]indene, 1,1-diphenylethylene, 4-benzhydrylstyrene, diisopropenylbenzene, diallylisophthalate, alpha-methylstyrene, a bis(vinylphenyl)ethane compound (e.g., 1,2-bis(4-vinylphenyl)ethane, 1,2-bis(3-vinylphenyl-4-vinylphenyl)ethane, 1,2-bis(3-vinylphenyl)ethane), a silane (e.g., a vinylsilane or allysilane), a siloxane (e.g., a vinylsiloxane or allysiloxane), or a silsesquioxane (e.g., a vinyl silsesquioxane or ally silsesquioxane). Without wishing to be bound by theory, it is believed the cross-linking agent can facilitate the curing of a curable composition when the composition is used to form a prepreg product or a laminate.

In some embodiments, the cross-linking agent described herein is in an amount of from at least about 0.01 wt % (e.g., at least about 0.02 wt %, at least about 0.04 wt %, at least about 0.05 wt %, at least about 0.06 wt %, at least about 0.08 wt %, at least about 0.1 wt %, at least about 0.2 wt %, at least about 0.4 wt %, at least about 0.5 wt %, at least about 0.6 wt %, at least about 0.8 wt %, or at least about 1 wt %) to at most about 10 wt % (e.g., at most about 9 wt %, at most about 8 wt %, at most about 7 wt %, at most about 6 wt %, at most about 5 wt %, at most about 4 wt %, at most about 3 wt %, at most about 2 wt %, or at most about 1 wt %) of the solid content of the curable compositions described herein. Preferably, the cross-linking agent is in an amount of from about 0.1 wt % to about 5 wt % of the solid content of the curable compositions described herein.

In some embodiments, the curable compositions described herein can optionally further include at least one (e.g., two or three or more) flame retardant. Suitable flame retardants can include phosphate ester flame retardants, bromobenzene flame retardants, phosphinate flame retardants, and phosphazene flame retardants. In some embodiments, the flame retardant can include 1,1'-(ethane-1,2-diyl) bis(pentabromobenzene) (e.g., Saytex 8010 available from Albemarle Corp.), N,N-ethylene-bis(tetrabromophthalimide) (e.g., BT-93 available from Albemarle Corp.), aluminum diethylphosphinate (e.g., OP930 and OP935 available from Clariant Specialty Chemicals), allyl phosphazene (e.g., SPV-100 available from Otsuka Chemical Co. Ltd.), benzylphenoxy cyclotriphosphazene, phenoxyphenoxy cyclotriphosphazene, hexaphenoxy cyclotriphosphazene (e.g., SPB-100 available from Otsuka Chemical Co. Ltd.), resorcinol bis(di-2,6-dimethylphenyl phosphate) (e.g., PX-200 available from Daihachi Chemical Industry Co., Ltd.), 6H-dibenz[c,e][1,2]oxaphosphorin-6,6'-(1,4-ethanediyl)bis-6,6'-dixoide (e.g., Altexia products available from Albemarle Corp.), BP-PZ, or PQ-60. BP—PZ is a phsphazene flame retardant available from Otsuka Chemical Co. Ltd. PQ-60 is a flame retardant available from Chin Yee Chemical Industries Co. Ltd., which is also known as BES5-1150 available from Regina Electronic Materials (Shanghai) Co., Ltd. Without wishing to be bound by theory, it is believed that the flame retardant can significantly reduce the flammability of the products (e.g., laminates) formed from the curable compositions described herein.

In some embodiments, the flame retardant is in an amount of from at least about 1 wt % (e.g., at least about 2 wt %, at least about 4 wt %, at least about 5 wt %, at least about 6 wt %, at least about 8 wt %, at least about 10 wt %, at least about 12 wt %, at least about 14 wt %, at least about 15 wt %, at least about 16 wt %, at least about 18 wt %, or at least about 20 wt %) to at most about 50 wt % (e.g., at most about 48 wt %, at most about 46 wt %, at most about 45 wt %, at most about 44 wt %, at most about 42 wt %, at most about 40 wt %, at most about 38 wt %, at most about 36 wt %, at most about 35 wt %, at most about 34 wt %, at most about 32 wt %, at most about 30 wt %, at most about 28 wt %, at most about 26 wt %, at most about 25 wt %, at most about 24 wt %, at most about 22 wt %, at most about 20 wt %, at most about 18 wt %, at most about 16 wt %, or at most about 15 wt %) of the solid content of the curable compositions described herein. In some embodiments, the flame retardant is in an amount of from about 10 wt % to about 30 wt % (e.g., from about 15 wt % to about 25 wt %). Without wishing to be bound by theory, it is believed that, if the flame retardant is less than about 1 wt % of a curable composition, the curable composition may not have sufficient flame retardance. In addition, without wishing to be bound by theory, it is believed that, if the flame retardant is more than about 50 wt % of a curable composition, the curable composition may have inferior mechanical properties.

In some embodiments, the curable compositions described herein can optionally further include at least one (e.g., two or three or more) coupling agent. In some embodiments, the coupling agent can include a silane, a titanate, or a zirconate. Examples of suitable coupling agents include methacryloxypropyl-trimethoxysilane, vinyltryimethoxysilane, hydrolyzed vinylbenzylaminoethylamino-propyltrimethoxy silane, phenyltrimethoxysilane, p-styryltrimethoxysilane, 3-isocyanatepropyltriethoxysilane, 3-methacryloxypropyl trimethoxysilane, tetra(2,2-diallyloxymethyl-1-butyl)bis(ditridecylphosphite)titanate, or tetra (2,2-diallyloxymethyl-1-butyl)bis(ditridecylphosphite)zirconate. Without wishing to be bound by theory, it is believed that the coupling agent can improve the dispersity of inorganic filler in a curable composition, improve the adhesion between fillers and polymers in a curable composition and between glass cloth in a prepreg and polymers in a curable composition, improve the moisture and solvent resistance of a curable composition, and decrease the number of voids in a curable composition.

In some embodiments, the coupling agent is in an amount of from at least about 0.01 wt % (e.g., at least about 0.02 wt %, at least about 0.04 wt %, at least about 0.05 wt %, at least about 0.06 wt %, at least about 0.08 wt %, at least about 0.1 wt %, at least about 0.2 wt %, at least about 0.4 wt %, at least about 0.5 wt %, at least about 0.6 wt %, at least about 0.8 wt %, or at least about 1 wt %) to at most about 5 wt % (e.g., at most about 4.5 wt %, at most about 4 wt %, at most about 3.5 wt %, at most about 3 wt %, at most about 2.5 wt %, at most about 2 wt %, at most about 1.5 wt %, at most about 1 wt %, or at most about 0.5 wt %) of the solid content of the curable compositions described herein. Preferably, the cross-linking agent is in an amount of from about 0.1 wt % to about 5 wt % of the solid content of the curable compositions described herein.

In some embodiments, the curable compositions described herein can optionally further include at least one (e.g., two or three or more) organic solvent. In some embodiments, the organic solvent includes 2-heptanone, methyl ethyl ketone, methyl isobutyl ketone, methyl n-amyl ketone, methyl isoamyl ketone, cyclopentanone, cyclohexanone, benzene, anisole, toluene, 1,3,5-trimethylbenzene, xylene, propylene glycol monomethyl ether, propylene glycol monomethyl ether acetate, or a combination thereof.

In some embodiments, the organic solvent is in an amount of from at least about 20 wt % (e.g., at least about 22 wt %, at least about 24 wt %, at least about 25 wt %, at least about 26 wt %, at least about 28 wt %, at least about 30 wt %, at least about 32 wt %, at least about 34 wt %, at least about 35 wt %, at least about 36 wt %, at least about 38 wt %, or at least about 40 wt %) to at most about 50 wt % (e.g., at most about 48 wt %, at most about 46 wt %, at most about 45 wt %, at most about 44 wt %, at most about 42 wt %, at most about 40 wt %, at most about 38 wt %, at most about 36 wt %, at most about 35 wt %, at most about 34 wt %, at most about 32 wt %, at most about 30 wt %, at most about 28 wt %, at most about 26 wt %, or at most about 25 wt %) of the total weight of the curable compositions described herein. Without wishing to be bound by theory, it is believed that, if the organic solvent is less than about 20 wt % of a curable composition, the viscosity of the curable composition may be too high such that the curable composition may be not processed easily. In addition, without wishing to be bound by theory, it is believed that, if the organic solvent is more than about 50 wt % of a curable composition, the viscosity of the curable composition may be too low to keep the coated composition on a surface of a substrate, which can lower coating uniformity and coating efficiency.

The curable compositions described herein can be prepared by methods well known in the art. For example, the curable compositions can be prepared by mixing the components together.

In some embodiments, the present disclosure features a film (e.g., a free-standing or supported film) prepared from a curable composition described herein. For example, a supported film can be prepared by coating a curable composition on a substrate to form a film supported by the substrate. As another example, a free-standing film can be prepared by coating a curable composition on a substrate to form a layer (e.g., a polymeric layer) and removing (e.g., peeling) the layer from the substrate to form the free-standing film. In some embodiments, the film (e.g., a free-standing or supported film) is partially cured. In some embodiments, the film (e.g., a free-standing or supported film) is not cured.

In some embodiments, the present disclosure features a prepreg product prepared from a curable composition described herein. In some embodiments, the prepreg product includes a base material (e.g., a woven or non-woven substrate (such as fabric)) impregnated with a curable composition described herein. The base material is also known as the supporting or reinforcing material. The prepreg products described herein can be used in the electronics industry, e.g., to produce printed wiring or circuit boards.

In general, the prepreg products described herein can be produced by impregnating a base material (usually based on glass fibers, either as a woven or nonwoven substrate or in the form of a cross-ply laminate of unidirectionally oriented parallel filaments) with a curable composition described herein, followed by curing the curable composition wholly or in part (e.g., at a temperature ranging from about 150° C. to about 250° C.). The base material impregnated with a partially cured composition is usually referred to as a "prepreg." As mentioned herein, the terms "prepreg" and "prepreg product" are used interchangeably. To make a printed wiring board from a prepreg, one or more layers of the prepreg are laminated with, for example, one or more layers of copper.

In some embodiments, the base material (e.g., containing a woven or non-woven substrate) used in the prepregs described herein can include inorganic fiber base materials such as glass and asbestos. A glass fiber base material is preferable from the viewpoint of flame resistance. Examples of the glass fiber base materials include, but are not limited to, woven fabrics using E glass, NE glass (from Nittobo, Japan), C glass, D glass, S glass, T glass, Quartz glass, L glass, L2 glass, or NER glass; glass non-woven fabrics in which short fibers are adhered into a sheet-like material with an organic binder; and those in which glass fiber and other fiber types are mixed and made fabric.

In some embodiments, a prepreg can be produced by impregnating a curable composition described herein into a base material (e.g., a woven or non-woven substrate) followed by drying. In some embodiments, the prepregs described herein can have a resin content as defined herein of from at least about 50 wt % (e.g., at least about 52 wt %, at least about 54 wt %, at least about 55 wt %, at least about 56 wt %, at least about 58 wt %, at least about 60 wt %, at least about 62 wt %, at least about 64 wt %, or at least about 65 wt %) to at most about 80 wt % (e.g., at most about 78 wt %, at most about 76 wt %, at most about 75 wt %, at most about 74 wt %, at most about 72 wt %, at most about 70 wt %, at most about 68 wt %, at most about 66 wt %, or at most about 65 wt %). Without wishing to be bound by theory, it is believed that a prepreg having a relatively high resin content would have improved electrical properties, while a prepreg having a relatively low resin content would have improved thermal properties.

In some embodiments, a metal substrate can be applied to one or both surfaces of the prepreg thus formed to form a laminate. In some embodiments, the prepreg formed above can optionally be laminated with one or more layers of prepregs as necessary to make a composite structure, and a metal foil (e.g., a copper or aluminum foil) can be applied to one or both surfaces of the composite structure to obtain a laminate (or a metal clad laminate). The laminate thus formed can optionally be subjected to further treatment, such as pressurization and hot pressing, which can at least partially (or fully) cure the prepreg layers. The laminate (e.g., a copper clad laminate) can be further layered with additional prepreg layers and cured to make a multilayer printed circuit board.

In some embodiments, the present disclosure features a laminate that includes at least one (e.g., two or three or more) layer prepared from the prepreg product described herein. In some embodiments, the laminate can include (1) a copper substrate (e.g., a copper foil) and (2) at least one prepreg layer laminated on the copper substrate. In some embodiments, one or both surfaces of the prepreg layer can be laminated with the copper substrate. In some embodiments, the present disclosure features a multilayer laminate in which multiple copper clad laminates described herein are stacked on top of each other optionally with one or more prepreg layers between two copper clad laminates.

The multilayer laminate thus formed can be pressed and cured to form a multilayer printed circuit board.

In some embodiments, the prepreg layer (i.e., the layer prepared from the prepreg product described herein) or the laminate has a dielectric constant (Dk) of from at most about 3.5 (e.g., at most about 3.4, at most about 3.3, at most about 3.1, or at most about 3) to at least about 2.5 at 10 GHz. In some embodiments, the curable composition can include a high Dk filler (e.g., barium titanate). In such embodiments, the prepreg layer in the laminate can have a relative high Dk, such as from at least about 3.5 (e.g., at least about 4) to at most about 15 (e.g., at most about 12, at most about 10, or at most about 8).

In some embodiments, the prepreg layer (i.e., the layer prepared from the prepreg product described herein) or the laminate has a dissipation factor (Df) of from at most about 0.0025 (e.g., at most about 0.0024, at most about 0.0023, at most about 0.0022, at most about 0.0021, at most about 0.002, at most about 0.0019, at most about 0.0018, at most about 0.0017, at most about 0.0016, or at most about 0.0015) to at least about 0.0005 (e.g., at least about 0.0006, at least about 0.0008, or at least about 0.001). Preferably, the prepreg layer or the laminate has a Df of at most about 0.0017 (e.g., at most about 0.0015).

In some embodiments, the present disclosure features a printed circuit or wiring board obtained from the laminate described herein. For example, the printed circuit or wiring board can be obtained by performing circuit processing on the copper foil of a copper foil clad laminated board. Circuit processing can be carried out by, for example, forming a resist pattern on the surface of the copper foil, removing unnecessary portions of the foil by etching, removing the resist pattern, forming the required through holes by drilling, again forming the resist pattern, plating to connect the through holes, and finally removing the resist pattern. A multi-layer printed circuit or wiring board can be obtained by additionally laminating the above copper foil clad laminated board on the surface of the printed wiring board obtained in the above manner under the same conditions as described above, followed by performing circuit processing in the same manner as described above. In this case, it is not always necessary to form through holes, and via holes may be formed in their place, or both can be formed. For example, in a printed circuit board (PCB), two pads in corresponding positions on different layers of the circuit board can be electrically connected by a via hole through the board, in which the via hole can be made conductive by electroplating. These laminated boards are then laminated the required number of times to form a printed circuit or wiring board.

The printed circuit or wiring board produced in the above manner can be laminated with a copper substrate on one or both surfaces in the form of an inner layer circuit board. This lamination molding is normally performed under heating and pressurization. A multi-layer printed circuit board can then be obtained by performing circuit processing in the same manner as described above on the resulting metal foil clad laminated board.

EXAMPLES

The present disclosure is illustrated in more detail with reference to the following examples, which are for illustrative purposes and should not be construed as limiting the scope of the present disclosure.

Materials

In the Examples below, Septon 2104 is a SEPS elastomer containing about 65 wt % styrene monomer unit or 65 wt % polystyrene available from Kuraray Co. Ltd. Tuftec H1043 is a SEBS elastomer containing about 67 wt % styrene monomer unit or 67 wt % polystyrene available from Asahi Kasei Corp. Tuftec M1913 is a SEBS elastomer containing about 30 wt % styrene monomer unit or 30 wt % polystyrene and modified by maleic anhydride available from Asahi Kasei Corp. Tuftec MP10 is a SEBS elastomer containing about 30 wt % styrene monomer unit or 30 wt % polystyrene and containing an amine end group available from Asahi Kasei Corp. Septon V9461 is a styrene/4-methyl styrene/isoprene/butadiene polymer that contains about 30 wt % styrene monomer units (including both styrene and 4-methyl styrene monomer units) available from Kuraray Co. Ltd. OPE-2st 2200 is a polyphenylene ether having a number average molecular weight of about 2200 available from Mitsubishi Gas Chemical Co. OPE-2st 1200 is a polyphenylene ether having a number average molecular weight of about 1200 available from Mitsubishi Gas Chemical Co. SC2500-SVJ is a silica available from Admatechs Co. Ltd. and GT130MC is a silica available from Denka Co. Ltd. Saytex-8010 is 1,1'(ethane-1,2-diyl)bis[pentabromo-benzene] available from Albemarle Corp. Curox CC-DC (CCDFB) is 2,3-dimethyl-2,3-diphenylbutane available from United Initiators, Inc. $Al_2O_3$ is available from Sanyo Electric Co., Ltd. under the trade name AX3-32. SMA EF80 is a styrene maleic anhydride copolymer available from Total Cray Valley, which contains 88.9 wt % styrene monomer unit or 88.9 wt % polystyrene and 11.1 wt % maleic anhydride. VulCup R is α, α-bis(t-butylperoxy)diisopropylbenzene from Arkema Inc. BES5-7100 is bis(4-vinylphenyl)ethane (BVPE) from Regina Electronic materials Co. Ltd. OFS-6030 is methacryloxypropyl Trimethoxysilane available from Dow, Inc. A1535H is a SEBS elastomer containing about 57 wt % styrene monomer unit or 57 wt % polystyrene available from Kraton Corporation. 1,2-H-SBS-L is a partially hydrogenated SBS elastomer available from Nisso. EQ2410-SMC and EQ1010-SMC are silica particles available from Third Age Technology (TAT).

GENERAL PROCEDURE 1

Preparation of Prepregs and Laminates

A curable composition was poured into a metal pan and a glass cloth (2116NE Nittobo) was impregnated with the curable composition. The impregnated glass cloth was coated through a gap of metal bars having a gap width of 11-12 mil. The sample was dried with air flow at room temperature for 10 minutes and then heated up to 130° C. for 4 minutes to form a dried prepreg. The dried prepreg was cut into 12×12 inch pieces and two layers of prepreg were laminated with Cu on both sides to form a laminate. The laminate was cured as follows. After the laminate was set into the pressing machine, a pressure of 350 psi was applied to the two-layer prepreg, which was then cured using either cycle A or B below:

Cycle A: The laminate was heated from room temperature to 420° F. at a heating rate of 6° F./min, kept for 2 hours at 420° F., and cooled down to room temperature at a cooling rate of 10° F./min.

Cycle B: The laminate was heated from room temperature to 310° F. at a heating rate of 6° F./min, kept for 30 minutes at 310° F., heating from 310° F. to 420° F. at a heating rate of 6° F./min, kept for 80 minutes at 420° F., and cooled down to room temperature at a cooling rate of 10° F./min.

GENERAL PROCEDURE 2

Property Measurements

Resin Content (RC)

The weight of glass cloth was measured before it was coated with a curable composition. After coating and drying, the total weight of the prepreg thus formed was measured. RC was calculated based on the following equation:

$$RC=(\text{Total prepreg weight}-\text{Glass cloth weight})/(\text{Total prepreg weight})$$

Solution Stability

The components (except for the filler, flame retardant, and catalyst) in a curable composition were mixed uniformly in glass vials and kept for 24 hours. After 24 hours, the appearance of the mixture was observed. If the mixture has clear phase separation, it is considered unstable. If the solution has no phase separation, it is considered stable.

Cu Peel Strength Test

Cu peel strength was measured based on 1 oz Cu weight per unit area using the IPC-TM-650 TEST METHODS MANUAL 2.4.8. Peel Strength. United SSTM-1 Model was used for Cu peel strength measurement.

Inner Layer Bond Strength (ILBS) test ILBS was measured based on IPC-TM650 2.4.40. United SSTM-1 Model was used for ILBS measurement. Specifically, a two-layer laminate with 2116NE glass cloth (From Nittobo) was used.

Dk and Df tests

Df and Dk values were analyzed by using Split Post Dielectric Resonator (SPDR) methods. The Df and Dk values at 10 GHz were measured by Network Analyzer N5230A from Agilent Technologies. A two-layer laminate with 2116NE glass cloth was used for the measurement. "AB" refers to the measurement after keeping samples at 120° C. for 2 hours. "RT" refers to the measurement after keeping samples under 45-55% humidity at room temperature for 16 hour.

Flammability

Flammability was evaluated based on UL94.

Example 1: Preparation of Curable Composition 1 (CC-1) and Its Laminate

After toluene 295.7 g was added into a vessel, 41.8 g of Tuftec M1913 (which was used as the third polymer described herein) was added into the vessel and the mixture was mixed using an air mixer for 3 hours until a uniform solution was formed. 41.8 g Septon 2104 (which was used as the second polymer described herein) was added into the vessel and the mixture was mixed using an air mixer for 3 hours until a uniform solution was formed. 669.5 g of a toluene solution containing 50 wt % Copolymer A described in Example 1 of U.S. Pat. No. 11,130,861 (which was used as the first polymer described herein) was added into the vessel and the mixture was mixed using an air mixer for 1 hour until a uniform solution was used. 260.3 g of SC2500-SVJ (which was used as a silica filler) was added into vessel and the mixture was mixed for 2 hours. 173.5 g of saytex-8010 (which was used as a flame retardant) was added into the vessel and the mixture was mixed using a high shear mixer (Ross HSM-100LH-1) at a rotational speed of 5000 rpm for 1 hour with ice cooling. 17.4 g of CCDFB (which was used as a catalyst) was added into the vessel and the mixture was mixed using an air mixer for 1 hour to obtain composition CC-1. CC-1 was used to form a laminate according to General Procedure 1 and Cycle B.

Example 2: Preparation of Curable Composition 2 (CC-2) and Its Laminate

Curable composition CC-2 was identical to curable composition CC-1. CC-2 was used to form a laminate according to General Procedure 1 and Cycle A.

Example 3: Preparation of Curable Composition 3 (CC-3) and Its Laminate

Curable composition CC-3 was prepared in a manner similar to curable composition CC-1 except that 41.8 g of Tuftec M1913 was replaced by 41.8 g of Tuftec MP10. CC-3 was used to form a laminate according to General Procedure 1 and Cycle B.

Example 4: Preparation of Curable Composition 4 (CC-4) and Its Laminate

Curable composition CC-4 was prepared in a manner similar to curable composition CC-1 except that 263.3 g of toluene, 21.1 g of Septon V9461, 42.2 g of Tuftec H1043, 718 g of a toluene solution containing 50 wt % Copolymer A described in Example 1 of U.S. Pat. No. 11,130,861, 262.7 g of SC2500-SVJ, 175.1 g of saytex-8010, and 17.5 g of CCGFB were used to prepare CC-4. CC-4 was used to form a laminate according to General Procedure 1 and Cycle A.

Example 5: Preparation of Curable Composition 5 (CC-5) and Its Laminate

Curable composition CC-5 was prepared in a manner similar to curable composition CC-1 except that 398.2 g of toluene, 62.2 g of Tuftec M1911, 62.2 g of Septon 2104, 542.2 g of a toluene solution containing 50 wt % Copolymer A described in Example 1 of U.S. Pat. No. 11,130,861, 253 g of $Al_2O_3$as a filler, 165.9 g of saytex-8010, and 14.1 g of CCDFB were used to prepare CC-5. CC-5 was used to form a laminate according to General Procedure 1 and Cycle A.

Example 6: Preparation of Curable Composition 6 (CC-6) and Its Laminate

Curable composition CC-6 was prepared in a manner similar to curable composition CC-1 except that 401.9 g of toluene, 41.8 g of BES5-7100 as a crosslinker, 59.7 g of Tuftec M1911, 59.7 g of Septon 2104, 521.8 g of a toluene solution containing 50 wt % Copolymer A described in Example 1 of U.S. Patent No. 11,130,861, 242.6 g of $Al_2O_3$, 159.1 g of saytex-8010, and 13.5 g of CCDFB were used to prepare CC-6. CC-6 was used to form a laminate according to General Procedure 1 and Cycle A.

Example 7: Preparation of Curable Composition 7 (CC-7) and Its Laminate

Curable composition CC-7 was prepared in a manner similar to curable composition CC-1 except that 343.2 g of toluene, 18.9 g of BES5-7100 as a crosslinker, 33.2 g of 1,2-H-SBS-L as an additive, 44.2 g of Tuftec M1913, 44.2 g of Septon 2104, 604.9 g of a toluene solution containing 53 wt % Copolymer A described in Example 1 of U.S. Pat. No. 11,130,861, 288.3 g of EQ2410-SMC and 123.6 g of EQ1010-SMC as silica fillers, 209.4 g of saytex-8010, and 9.0 g of CCDFB were used to prepare CC-7. CC-7 was used to form a laminate according to General Procedure 1 and Cycle A.

Comparative Example 1: Preparation of Comparative Curable Composition 1 (CCC-1) and Its Laminate Comparative curable composition CCC-1 was prepared in a manner similar to curable composition CC-1 except that 98.3 g of toluene, 837.4 g of a toluene solution containing 50 wt % Copolymer A described in Example 1 of U.S. Pat. No. 11,130,861, 325.5 g of SC2500-SVJ, 217 g of saytex-8010, and 21.7 g of CCDFB were used to prepare CCC-1. CCC-1 was used to form a laminate according to General Procedure 1 and Cycle A.

Comparative Example 2: Preparation of Comparative Curable Composition 2 (CCC-2) and Its Laminate Comparative curable composition CCC-2 was prepared in a manner similar to curable composition CC-1 except that 287.6 g of toluene, 40.7 g of Tuftec M1913, 732.8 g of a toluene solution containing 50 wt % Copolymer A described in Example 1 of U.S. Pat. No. 11,130,861, 253.2 g of SC2500-SVJ, 168.8 g of saytex-8010, and 16.9 g of CCDFB were used to prepare CCC-2. CCC-2 was used to form a laminate according to General Procedure 1 and Cycle A.

Comparative Example 3: Preparation of Comparative Curable Composition 3 (CCC-3) and Its Laminate Comparative curable composition CCC-3 was prepared in a manner similar to curable composition CC-1 except that 287.6 g of toluene, 40.7 g of Septon 2104, 732.8 g of a toluene solution containing 50 wt % Copolymer A described in Example 1 of U.S. Pat. No. 11,130,861, 253.2 g of SC2500-SVJ, 168.8 g of saytex-8010, and 16.9 g of CCDFB were used to prepare CCC-3. CCC-3 was used to form a laminate according to General Procedure 1 and Cycle A.

Comparative Example 4: Preparation of Comparative Curable Composition 4 (CCC-4) and Its Laminate Comparative curable composition CCC-4 was prepared in a manner similar to curable composition CC-1 except that 113.9 g of toluene, 673.6 g of a toluene solution containing 50 wt % Copolymer A described in Example 1 of U.S. Pat. No. 11,130,861, 6 g of OFS-6030 as a coupling agent, 440.1 g of SC2500-SVJ, 165 g of saytex-8010, and 1.4 g of Vul-Cup R were used to prepare CCC-4. CCC-4 was used to form a laminate according to General Procedure 1 and Cycle A.

Comparative Example 5: Preparation of Comparative Curable Composition 5 (CCC-5) and Its Laminate Comparative curable composition CCC-5 was prepared in a manner similar to curable composition CC-1 except that 165.1 g of toluene, 269.6 g of -OPE-2st 2200, 500.1 g of a toluene solution containing 50 wt % Copolymer A described in Example 1 of U.S. Pat. No. 11,130,861, 293.4 g of GT130MC, 195.6 g of saytex-8010, and 10.1 g of CCDFB were used to prepare CCC-5. CCC-5 was used to form a laminate according to General Procedure 1 and Cycle A.

Comparative Example 6: Preparation of Comparative Curable Composition 6 (CCC-6) and Its Laminate Comparative curable composition CCC-6 was prepared in a manner similar to curable composition CC-1 except that 287.6 g of toluene, 40.7 g of SMA EF80, 732.8 g of a toluene solution containing 50 wt % Copolymer A described in Example 1 of U.S. Pat. No. 11,130,861, 253.2 g of SC2500-SVJ, 168.8 g of saytex-8010, and 16.9 g of CCDFB were used to prepare CCC-6. CCC-6 was used to form a laminate according to General Procedure 1 and Cycle A.

Comparative Example 7: Preparation of Comparative Curable Composition 7 (CCC-7) and Its Laminate Comparative curable composition CCC-7 was prepared in a manner similar to curable composition CC-1 except that 407.3 g of toluene, 43.6 g of Tuftec M1913, 43.6 g of Septon 2104, 536.1 g of OPE-2ST 1200, 270.9 g of SC2500-SVJ, 180.6 g of saytex-8010, and 18.1 g of CCDFB were used to prepare CCC-7. CCC-7 was used to form a laminate according to General Procedure 1 and Cycle A.

Comparative Example 8: Preparation of Comparative Curable Composition 8 (CCC-8) and Its Laminate Comparative curable composition CCC-8 was prepared in a manner similar to curable composition CC-1 except that 295.7 g of toluene, 41.8 g of Tuftec M1913, 41.8 g of A1535H, 669.5 g of a toluene solution containing 50 wt % Copolymer A described in Example 1 of U.S. Pat. No. 11,130,861, 260.3 g of SC2500-SVJ, 173.5 g of saytex-8010, and 17.4 g of CCDFB were used to prepare CCC-8. CCC-8 was used to form a laminate according to General Procedure 1 and Cycle A.

Evaluation Example 1

Curable compositions 1-7 (CC-1 to CC-7) and the properties of the laminates formed from these compositions are summarized in Table 1 below. The copper layers in the laminates had a thickness of about 35 μm.

TABLE 1

| Components | CC-1 | CC-2 | CC-3 | CC-4 | CC-5 | CC-6 | CC-7 |
|---|---|---|---|---|---|---|---|
| First Polymer | Copolymer A | Copolymer A | Copolymer A | Copolymer A | Copolymer A | Copolymer A | Copolymer A |
| Second Polymer | Septon 2104 | Septon 2104 | Septon 2104 | Tuftec H1043 | Septon 2104 | Septon 2104 | Septon 2104 |
| Third Polymer | Tuftec M1913 | Tuftec M1913 | Tuftec MP10 | Septon V9461 | Tuftec M1911 | Tuftec M1911 | Tuftec M1913 |
| Other Polymer/ Additive | None | None | None | None | None | BES5-7100 | 1,2-H-SBS-L/ BES5-7100 |
| Filler | SC2500-SVJ silica | SC2500-SVJ silica | SC2500-SVJ silica | SC2500-SVJ silica | $Al_2O_3$ | $Al_2O_3$ | EQ2410-SMC/ EQ1010-SMC |
| Flame Retardant | Saytex-8010 | Saytex-8010 | Saytex-8010 | Saytex-8010 | Saytex-8010 | Saytex-8010 | Saytex-8010 |
| Catalyst | CCDFB | CCDFB | CCDFB | CCDFB | CCDFB | CCDFB | CCDFB |
| Test Results | | | | | | | |
| ILBS (lbs/inch) | 24 | 2.3 | 2.5 | 2 | 2.9 | 3.3 | 2.7 |
| Cu peel strength 1 oz (lbs/inch) | 2.7 | 2.7 | 3 | 2.5 | 2.5 | 2.9 | 2.7 |
| Solution stability | Good* | Good | Good | Good | Good | Good | Good |
| Df AB | 0.00163 | 0.00158 | 0.00152 | 0.00152 | 0.00172 | 0.00175 | 0.00156 |
| Dk AB | 3.2 | 3.3 | 3.3 | 3.2 | 3.5 | 3.5 | 3.5 |
| Df RT | 0.00177 | 0.00157 | 0.00167 | 0.00157 | 0.00173 | 0.00174 | 0.00164 |
| Dk RT | 3.2 | 3.3 | 3.3 | 3.2 | 3.5 | 3.4 | 3.5 |
| RC (%) | 61.4 | 57.4 | 61.3 | 57.1 | 55.4 | 55 | 52 |

TABLE 1-continued

| Components | CC-1 | CC-2 | CC-3 | CC-4 | CC-5 | CC-6 | CC-7 |
|---|---|---|---|---|---|---|---|
| Flammability | V0 pass | V0 pass | V0 pass | V0 pass | V0 pass | V0 pass | V0 pass |
| Press Cycle | B | A | B | A | A | A | A |

*"Good" means no phase separation.

Comparative curable compositions 1-8 (CCC-1 to CCC-8) and the properties of the laminates formed from these compositions are summarized in Table 2 below.

TABLE 2

| Components | CCC-1 | CCC-2 | CCC-3 | CCC-4 | CCC-5 | CCC-6 | CCC-7 | CCC-8 |
|---|---|---|---|---|---|---|---|---|
| First Polymer | Copolymer A | Copolymer A | Copolymer A | Copolymer A | Copolymer A | Copolymer A | None | Copolymer A |
| Second Polymer | None | None | Septon 2104 | None | None | None | Septon 2104 | A1535H |
| Third Polymer | None | Tuftec M1913 | None | None | None | None | Tuftec M1913 | Tuftec M1913 |
| Other Polymer | None | None | None | None | OPE-2st 2200 | SMA EF80 | OPE-2st 1200 | None |
| Filler | SC2500-SVJ silica | SC2500-SVJ silica | SC2500-SVJ silica | SC2500-SVJ silica | GT130MC silica | SC2500-SVJ silica | SC2500-SVJ silica | SC2500-SVJ silica |
| Flame Retardant | Saytex-8010 | Saytex-8010 | Saytex-8010 | Saytex-8010 | Saytex-8010 | Saytex-8010 | Saytex-8010 | Saytex-8010 |
| Catalyst | CCDFB | CCDFB | CCDFB | VulCup R | CCDFB | CCDFB | CCDFB | CCDFB |
| | | | | Test Results | | | | |
| ILBS | 1.2 | 1.7 | 1.7 | 1.2 | 1.8 | 0.6 | 3.6 | 2.7 |
| Cu peel strength 1 oz | 1.9 | 2.5 | 2.4 | 2.3 | 2.8 | 1.7 | 2.8 | 2.6 |
| Solution stability | Good | Poor* | Good | Good | Good | Good | Good | Poor |
| Df AB | 0.00162 | 0.00162 | 0.00166 | 0.00177 | 0.0017 | 0.00187 | 0.00254 | 0.00174 |
| Dk AB | 3.3 | 3.3 | 3.3 | 3.4 | 3.3 | 3.4 | 3.3 | 3.3 |
| Df RT | 0.00173 | 0.00173 | 0.00175 | 0.00185 | 0.00186 | 0.00197 | 0.0026 | 0.00179 |
| Dk RT | 3.3 | 3.3 | 3.3 | 3.4 | 3.3 | 3.4 | 3.3 | 3.3 |
| RC | 61.5 | 59.3 | 54.6 | 67.2 | 60.4 | 47 | 47 | 55.9 |
| Flammability | V0 pass | V0 pass | V0 pass | V0 pass | V0 pass | V0 pass | V0 pass | V0 pass |
| Press Cycle | A | A | A | A | A | A | A | A |

*"Poor" means that phase separation occurred.

As shown in Table 2, inventive compositions CC-1 to CC-7 surprisingly exhibited superior properties compared to comparative compositions CCC-1 to CCC-8. Specifically, without wishing to be bound by theory, it is believed that, because CCC-1 did not include the second and third polymers described herein, the laminate prepared from this composition exhibited poor ILBS and Cu peel strength. Without wishing to be bound by theory, it is believed that, because CCC-2 did not include the second polymer described herein, this composition exhibited severe phase separation and therefore poor solution stability. Without wishing to be bound by theory, it is believed that, because CCC-3 did not include the third polymer described herein, the laminate prepared from this composition exhibited poor ILBS. CCC-4 was similar to CCC-1 but contained a different amount of silica and a different catalyst. However, the results show that the laminate prepared from CCC-4 still exhibited poor ILBS and Cu peel strength. Without wishing to be bound by theory, it is believed that, because CCC-5 did not include the second and third polymers described herein, the laminate prepared from CCC-5 exhibited poor ILBS. Without wishing to be bound by theory, it is believed that, because CCC-6 did not include the third polymer described herein (as SMA EF80 includes more than 60 wt % styrene and has a relatively low molecular weight, which contributed to its brittleness), the laminate prepared from this composition exhibited poor ILBS and Cu peel strength. Without wishing to be bound by theory, it is believed that, because CCC-7 did not include the first polymer, the laminate prepared from this composition exhibited a relative high Df. Without wishing to be bound by theory, it is believed that, because CCC-8 included A1535H as the second polymer, the laminate prepared from this composition exhibited severe phase separation and therefore poor solution stability.

Other embodiments are within the scope of the following claims.

What is claimed is:

1. A curable composition, comprising:

at least one first polymer comprising a first monomer unit and a second monomer unit different from the first monomer unit, wherein the first monomer unit has the structure of formula (I):

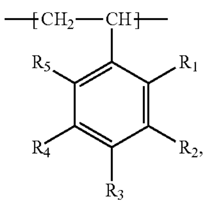

(I)

in which each of $R_1$, $R_2$, $R_3$, $R_4$, and $R_5$, independently, is H, halo, $C_1$-$C_6$ alkyl, or $C_2$-$C_6$ alkenyl, and the second monomer unit has the structure of formula (II):

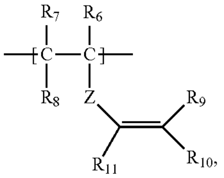

(II)

in which Z is arylene and each of $R_6$, $R_7$, $R_8$, $R_9$, $R_{10}$, and $R_{11}$, independently, is H or $C_1$-$C_6$ alkyl;

at least one second polymer comprising at least about 60 wt % of a styrene monomer unit; and at least one third polymer comprising at most about 60 wt % of a styrene monomer unit.

2. The composition of claim 1, wherein each of $R_1$, $R_2$, $R_3$, $R_4$, and $R_5$, independently, is H, methyl, ethyl, or vinyl.

3. The composition of claim 1, wherein Z is phenylene.

4. The composition of claim 1, wherein each of $R_6$, $R_7$, $R_8$, $R_9$, $R_{10}$, and $R_{11}$ is H.

5. The composition of claim 1, wherein the at least one first polymer further comprises a third monomer unit different from the first and second monomer units, the third monomer unit comprises a structure of formula (I), a norbornene group, a (meth)acrylate group, or an indane group.

6. The composition of claim 1, wherein the at least one first polymer is in an amount of from about 5 wt % to about 60 wt % of the solid content of the composition.

7. The composition of claim 1, wherein the styrene monomer unit in the at least one second or third polymer comprises an unsubstituted styrene monomer unit, a methylstyrene monomer unit, a t-butylstyrene monomer unit, or a bromostyrene monomer unit.

8. The composition of claim 1, wherein the at least one second polymer comprises at least about 62 wt % of the styrene monomer unit.

9. The composition of claim 1, wherein the at least one second polymer further comprises an ethylene monomer unit, a propylene monomer unit, a butylene monomer unit, an isobutylene monomer unit, a butadiene monomer unit, an isoprene monomer unit, or a cyclohexene monomer unit.

10. The composition of claim 1, wherein the at least one second polymer comprises a styrene isoprene styrene block copolymer, a styrene isoprene propylene styrene block copolymer, a styrene isoprene butylene styrene block copolymer, a styrene butylene styrene block copolymer, a styrene propylene styrene block copolymer, a styrene butylene block copolymer, a styrene butadiene block copolymer, a styrene ethylene propylene styrene block copolymer, or a styrene ethylene butylene styrene block copolymer.

11. The composition of claim 1, wherein the at least one second polymer is in an amount of from about 0.1 wt % to about 25 wt % of the solid content of the composition.

12. The composition of claim 1, wherein the at least one third polymer comprises from about 10 wt % to about 60 wt % of the styrene monomer unit.

13. The composition of claim 1, wherein the at least one third polymer further comprises an ethylene monomer unit, a propylene monomer unit, a butylene monomer unit, an isobutylene monomer unit, a butadiene monomer unit, an isoprene monomer unit, or a cyclohexene monomer unit.

14. The composition of claim 1, wherein the at least one third polymer comprises a polymer modified by maleic anhydride or a polymer containing an amine end group.

15. The composition of claim 1, wherein the at least one third polymer comprises a styrene ethylene butylene styrene block copolymer modified by maleic anhydride, a styrene ethylene butylene styrene block copolymer containing an amine end group, a styrene 4-methylstyrene isoprene butylene block copolymer, a 4-methylstyrene butylene block copolymer, or a styrene butadiene styrene block copolymer.

16. The composition of claim 1, wherein the at least one third polymer is in an amount of from about 0.1 wt % to about 25 wt % of the solid content of the composition.

17. The composition of claim 1, further comprises at least one filler.

18. The composition of claim 17, wherein the at least one filler comprises silica, boron nitride, barium titanate, barium strontium titanate, titanium oxide, glass, a fluoro-containing polymer, or silicone.

19. The composition of claim 17, wherein the at least one filler is in an amount of from about 1 wt % to about 80 wt % of the solid content of the composition.

20. The composition of claim 1, further comprises at least one radical initiator.

21. The composition of claim 20, wherein the at least one radical initiator comprises a peroxide, an aromatic hydrocarbon, or an azo compound.

22. The composition of claim 21, wherein the at least one radical initiator comprises di-(tert-butylperoxyisopropyl) benzene, 2,5-dimethyl-2,5-di(t-butylperoxy]hexyne-3, 2,5-dimethyl-2,5-di(t-butylperoxy] hexane, dicumylperoxide, 3,4-dimethyl 3,4-diphenyl hexane, or 2,3-dimethyl 2,3-diphenyl butane.

23. The composition of claim 20, wherein the at least one radical initiator is in an amount of from about 0.01 wt % to about 10 wt % of the solid content of the composition.

24. The composition of claim 1, further comprises at least one cross-linking agent.

25. The composition of claim 24, wherein the at least one cross-linking agent comprises triallylisocyanurate, triallyl cyanurate, a bis(vinylphenyl) ether, a bromostyrene, a polybutadiene, a poly(butadiene-co-styrene) copolymer, divinylbenzene, a di(meth)acrylate, a maleimide, a dimethylimidazole, a dicyclopentadiene, a tricyclopentadiene, allyl benzoxazine, allyl phosphazene, 2,4-diphenyl-4-methyl-1-pentene, trans-stilbene, 5-vinyl-2-norbornene, acenaphthylene, tricyclopentadiene, dimethano-1H-benz [f] indene, 1,1-diphenylethylene, 4-benzhydrylstyrene, diisopropenylbenzene, diallylisophthalate, alpha-methylstyrene, 1,2-bis(4-vinylphenyl) ethane, 1,2-bis(3-vinylphenyl-4-vinylphenyl) ethane, 1,2-bis(3-vinylphenyl) ethane), a silane, a siloxane, or a silsesquioxane.

26. The composition of claim 24, wherein the at least one cross-linking agent is in an amount of from about 0.01 wt % to about 10 wt % of the solid content of the composition.

27. The composition of claim 1, further comprising a flame retardant.

28. The composition of claim 27, wherein the flame retardant comprises 1,1'-(ethane-1,2-diyl)bis(pentabromobenzene), N,N-ethylene-bis(tetrabromophthalimide), aluminum diethylphosphinate, allyl phosphazene, benzylphenoxy cyclotriphosphazene, phenoxyphenoxy cyclotriphosphazene, hexaphenoxy cyclotriphosphazene, resorcinol bis(di-2,6-dimethylphenyl phosphate), 6H-dibenz [c,e] [1,2] oxaphosphorin-6,6'-(1,4-ethanediyl)bis-6,6'-dixoide, BP-PZ, or PQ-60.

29. The composition of claim 27, wherein the flame retardant is in an amount of from about 1 wt % to about 50 wt % of the solid content of the composition.

30. The composition of claim 1, further comprising at least one coupling agent.

31. The composition of claim 30, wherein the at least one coupling agent comprises a silane, a titanate, or a zirconate.

32. The composition of claim 31, wherein the at least one coupling agent comprises methacryloxypropyltrimethoxysilane, vinyltryimethoxysilane, hydrolyzed vinylbenzylaminoethylaminopropyltrimethoxy silane, phenyltrimethoxysilane, p-styryltrimethoxysilane, 3-isocyanatepropyltriethoxysilane, 3-methacryloxypropyl trimethoxysilane, tetra(2,2-diallyloxymethyl-1-butyl)bis (ditridecylphosphite) titanate, or tetra(2,2-diallyloxymethyl-1-butyl)bis(ditridecylphosphite) zirconate.

33. The composition of claim 30, wherein the at least one coupling agent is in an amount of from about 0.01 wt % to about 5 wt % of the solid content of the composition.

34. The composition of claim 1, further comprising an organic solvent.

35. The composition of claim 34, wherein the organic solvent comprises 2-heptanone, methyl ethyl ketone, methyl isobutyl ketone, methyl n-amyl ketone, methyl isoamyl ketone, cyclopentanone, cyclohexanone, benzene, anisole, toluene, 1,3,5-trimethylbenzene, xylene, propylene glycol monomethyl ether, propylene glycol monomethyl ether acetate, or a combination thereof.

36. The composition of claim 34, wherein the organic solvent is in an amount of from about 20 wt % to about 50 wt % of the composition.

37. A film prepared from the composition of claim 1.

38. A prepreg product, comprising a woven or non-woven substrate impregnated with the composition of claim 1.

39. The prepreg product of claim 38, wherein the substrate comprises a glass cloth.

40. A laminate, comprising at least one layer prepared from the prepreg product of claim 38.

41. The laminate of claim 40, further comprising at least one layer of a metal foil on a surface of the at least one layer prepared from the prepreg product.

42. The laminate of claim 41, wherein the metal foil is a copper foil.

43. The laminate of claim 41, wherein the layer prepared from the prepreg product has a dielectric constant of at most about 3.5 at 10 GHz.

44. The laminate of claim 41, wherein the layer prepared from the prepreg product has a dissipation factor of at most about 0.0025 at 10 GHz.

45. A circuit board for use in an electronic product, comprising the laminate of claim 40.

46. A method, comprising:

impregnating a woven or non-woven substrate with the composition of claim 1; and curing the composition to form a prepreg product.

* * * * *